(12) United States Patent
Park et al.

(10) Patent No.: US 12,500,189 B2
(45) Date of Patent: Dec. 16, 2025

(54) SEMICONDUCTOR PACKAGE

(71) Applicant: SAMSUNG ELECTRONICS CO., LTD., Suwon-si (KR)

(72) Inventors: Kunsang Park, Hwaseong-si (KR); Kyuha Lee, Seongnam-si (KR); Youngmin Lee, Hwaseong-si (KR); Seokho Kim, Hwaseong-si (KR); Inyoung Lee, Yongin-si (KR); Seokhwan Jeong, Suwon-si (KR); Sungdong Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 512 days.

(21) Appl. No.: 17/674,974

(22) Filed: Feb. 18, 2022

(65) Prior Publication Data
US 2023/0005853 A1    Jan. 5, 2023

(30) Foreign Application Priority Data

Jul. 2, 2021  (KR) .......................... 10-2021-0087242

(51) Int. Cl.
*H01L 23/00*   (2006.01)
*H01L 21/66*   (2006.01)
*H01L 25/065*  (2023.01)

(52) U.S. Cl.
CPC .............. *H01L 24/06* (2013.01); *H01L 22/32* (2013.01); *H01L 24/05* (2013.01); *H01L 24/08* (2013.01);

(Continued)

(58) Field of Classification Search
CPC ......... H01L 24/06; H01L 22/32; H01L 24/05; H01L 24/08; H01L 24/32;

(Continued)

(56) References Cited

U.S. PATENT DOCUMENTS

| 7,008,818 B2 | 3/2006 | Liu et al. |
| 8,232,654 B2 * | 7/2012 | Suh ....................... H01L 23/481 |
| | | 257/777 |

(Continued)

FOREIGN PATENT DOCUMENTS

| JP | 2009-289767 A | 12/2009 |
| KR | 1020200047930 A | 5/2020 |

(Continued)

*Primary Examiner* — Jay C Kim
(74) *Attorney, Agent, or Firm* — Muir Patent Law, PLLC

(57) ABSTRACT

A semiconductor package includes a first structure having a first insulating layer and a first bonding pad penetrating the first insulating layer, and a second structure on the first structure and having a second insulating layer bonded to the first insulating layer, a bonding pad structure penetrating the second insulating layer and bonded to the first bonding pad, and a test pad structure penetrating the second insulating layer and including a test pad in an opening penetrating the second insulating layer and having a protrusion with a flat surface, and a bonding layer filling the opening and covering the test pad and the flat surface, the protrusion of the test pad extending from a surface in contact with the bonding layer, and the flat surface of the protrusion being within the opening and spaced apart from an interface between the bonding layer and the first insulating layer.

19 Claims, 16 Drawing Sheets

(52) U.S. Cl.
CPC .......... *H01L 24/32* (2013.01); *H01L 25/0657* (2013.01); *H01L 2224/05582* (2013.01); *H01L 2224/06515* (2013.01); *H01L 2224/08146* (2013.01); *H01L 2224/08225* (2013.01); *H01L 2224/32145* (2013.01); *H01L 2224/32225* (2013.01); *H01L 2225/06541* (2013.01); *H01L 2924/37001* (2013.01)

(58) Field of Classification Search
CPC . H01L 2224/05582; H01L 2224/06515; H01L 2225/06541; H01L 2924/37001; H01L 25/0657; H01L 2224/08146; H01L 2224/08225; H01L 2224/32145; H01L 2224/32225; H01L 24/03; H01L 23/3128; H01L 24/09; H01L 24/80; H01L 2224/0384; H01L 2224/0392; H01L 2224/05017; H01L 2224/05559; H01L 2224/08145; H01L 2225/06527; H01L 25/18; H01L 23/3736; H01L 23/485; H01L 2224/08501; G01R 31/002; G01R 31/2896
See application file for complete search history.

(56) References Cited

U.S. PATENT DOCUMENTS

| | | | |
|---|---|---|---|
| 8,242,610 B2* | 8/2012 | Yamaguchi | H01L 24/05 257/781 |
| 8,324,622 B2 | 12/2012 | Zhang et al. | |
| 10,658,313 B2 | 5/2020 | Delacruz et al. | |
| 11,251,157 B2* | 2/2022 | Yang | H01L 24/32 |
| 11,289,438 B2* | 3/2022 | Hong | H01L 24/92 |
| 11,715,710 B2* | 8/2023 | Bourjot | H01L 24/08 438/18 |
| 11,728,301 B2* | 8/2023 | Chang | H01L 25/0657 257/48 |
| 2013/0221493 A1 | 8/2013 | Kim et al. | |
| 2019/0131277 A1 | 5/2019 | Yang et al. | |
| 2019/0393194 A1* | 12/2019 | Chen | H01L 24/92 |
| 2020/0335408 A1 | 10/2020 | Gao et al. | |

FOREIGN PATENT DOCUMENTS

| | | |
|---|---|---|
| KR | 1020210041363 | 4/2021 |
| KR | 1020210070176 A | 6/2021 |
| TW | 201919175 A | 5/2019 |
| TW | 201919193 A | 5/2019 |
| TW | 202114111 A | 4/2021 |

\* cited by examiner

SEMICONDUCTOR PACKAGE

CROSS TO REFERENCE TO RELATED APPLICATION

This application claims benefit of priority to Korean Patent Application No. 10-2021-0087242, filed on Jul. 2, 2021, in the Korean Intellectual Property Office, the disclosure of which is incorporated herein by reference in its entirety.

BACKGROUND

1. Field

Example embodiments of the present disclosure relate to a semiconductor package.

2. Description of the Related Art

With the development of the electronic industry, the demand for high-functionality, high-speed, and miniaturization of electronic components has increased. In line with this trend, a semiconductor packaging method of stacking and mounting a plurality of semiconductor chips on a semiconductor substrate or stacking a package on a package has been increasingly used.

SUMMARY

In an example embodiment of the present disclosure, a semiconductor package includes a first structure having one surface on which a first insulating layer and a bonding pad penetrating the first insulating layer are disposed, and a second structure having the other surface bonded to the one surface, and including a second insulating layer disposed on the other surface and bonded to the first insulating layer, a bonding pad structure penetrating the second insulating layer and bonded to the bonding pad, and a test pad structure penetrating the second insulating layer and bonded to the one surface, wherein the test pad structure includes a test pad disposed on a bottom surface of an opening penetrating the second insulating layer, and a bonding layer filling the opening and covering the test pad, and wherein the test pad has a protrusion on a surface in contact with the bonding layer, and the protrusion has a flat surface disposed on a level higher than a level of the other surface.

In an example embodiment of the present disclosure, a semiconductor package includes a lower structure in which an upper insulating layer and an upper bonding pad penetrating the upper insulating layer are disposed, an upper structure including a lower insulating layer bonded to the upper insulating layer, a bonding pad structure penetrating the lower insulating layer and bonded to the bonding pad, and a test pad structure penetrating the lower insulating layer structure and bonded to an upper surface of the upper insulating layer, wherein the test pad structure includes a test pad disposed on a bottom surface of an opening penetrating the lower insulating layer, and a bonding layer filling the opening and covering the test pad, and wherein the test pad has a thickness lower than that of the lower insulating layer, and has a lower surface disposed on a level higher than a level of the lower surface of the lower insulating layer.

In an example embodiment of the present disclosure, a semiconductor package includes a lower structure, and a plurality of semiconductor chips on the lower structure, wherein the plurality of semiconductor chips include first and second semiconductor chips in direct contact with each other, wherein the first semiconductor chip has one surface on which a first insulating layer and a bonding pad penetrating the first insulating layer are disposed, wherein the first semiconductor chip has the other surface bonded to the one surface, and including a second insulating layer disposed on the other surface and bonded to the first insulating layer, a bonding pad structure penetrating the second insulating layer and bonded to the bonding pad, and a test pad structure penetrating the second insulating layer and bonded to the one surface, wherein the test pad structure includes a test pad disposed on a bottom surface of an opening penetrating the second insulating layer, and a bonding layer filling the opening and covering the test pad, and wherein the test pad has a thickness lower than that of the second insulating layer, and has a lower surface disposed on a level higher than a level of a lower surface of the second insulating layer.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
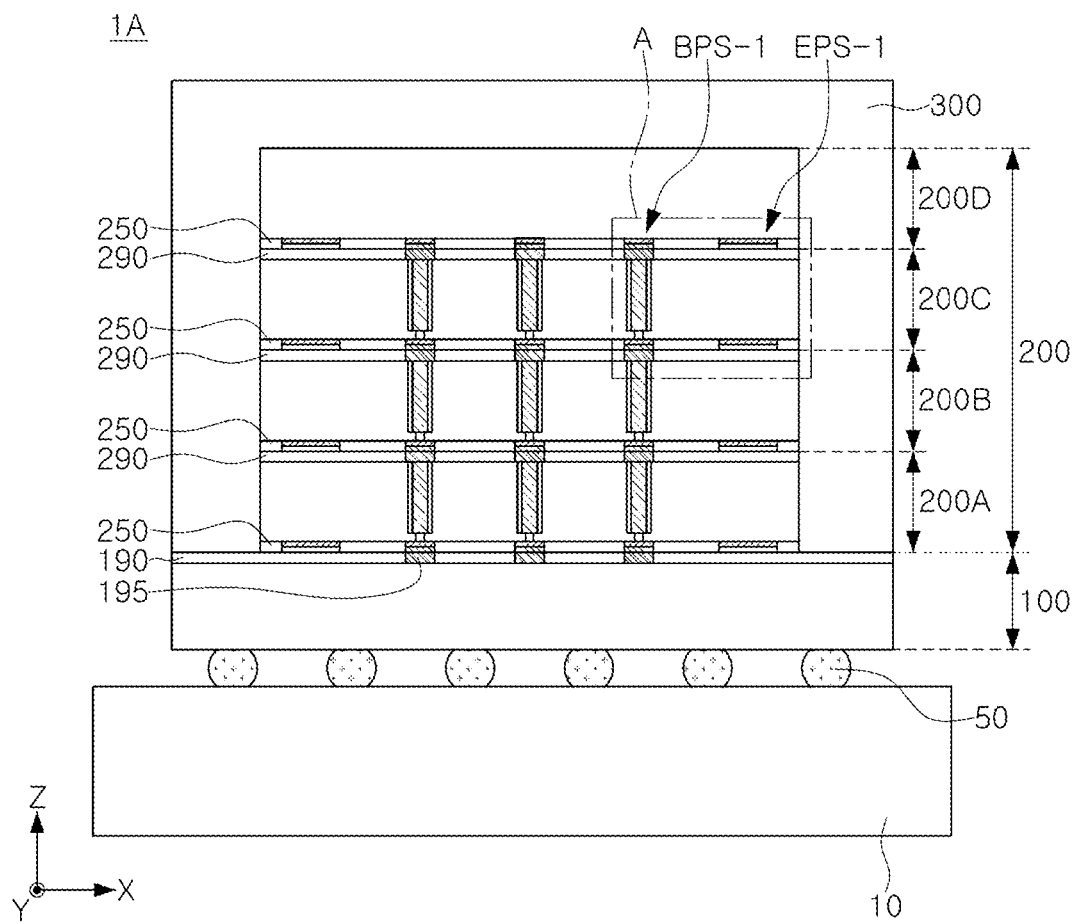
FIG. 1 is a cross-sectional diagram illustrating a semiconductor package according to an example embodiment of the present disclosure.
Figure 2:
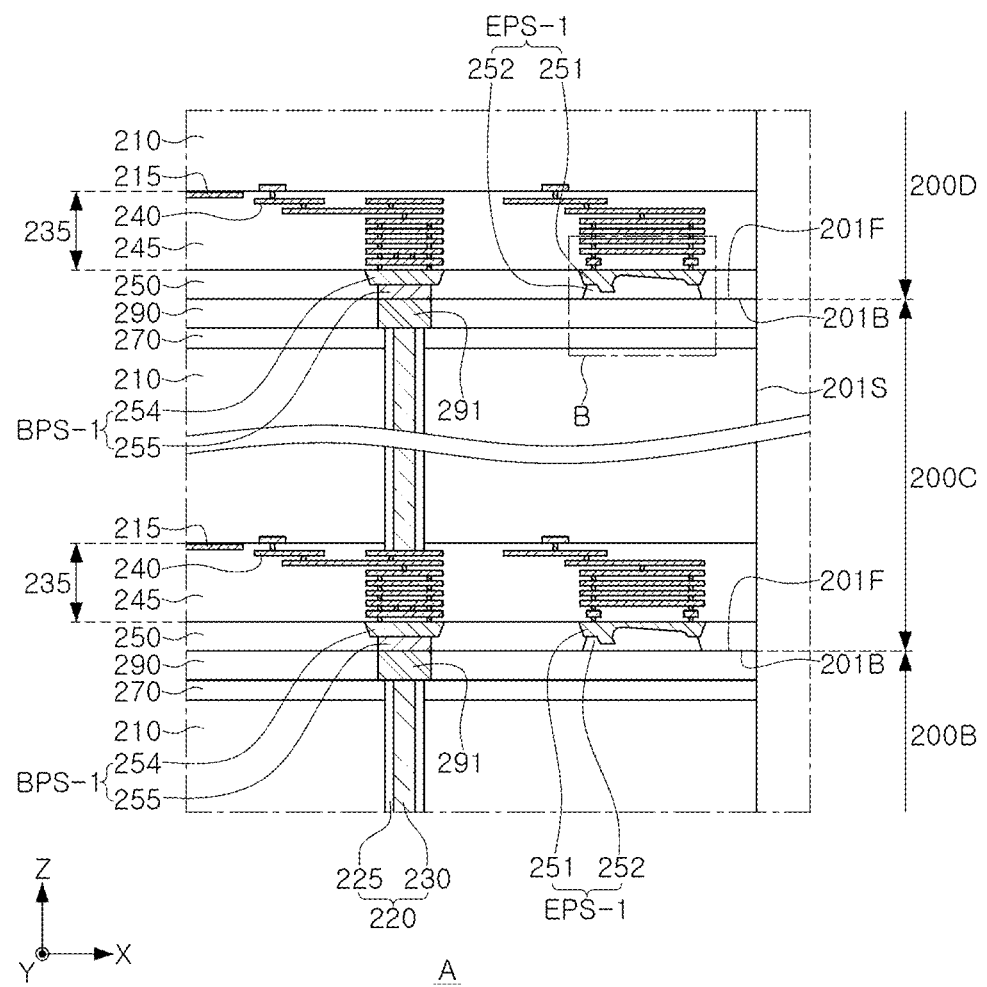
FIG. 2 is an enlarged diagram of portion "A" in FIG. 1.
Figure 3:
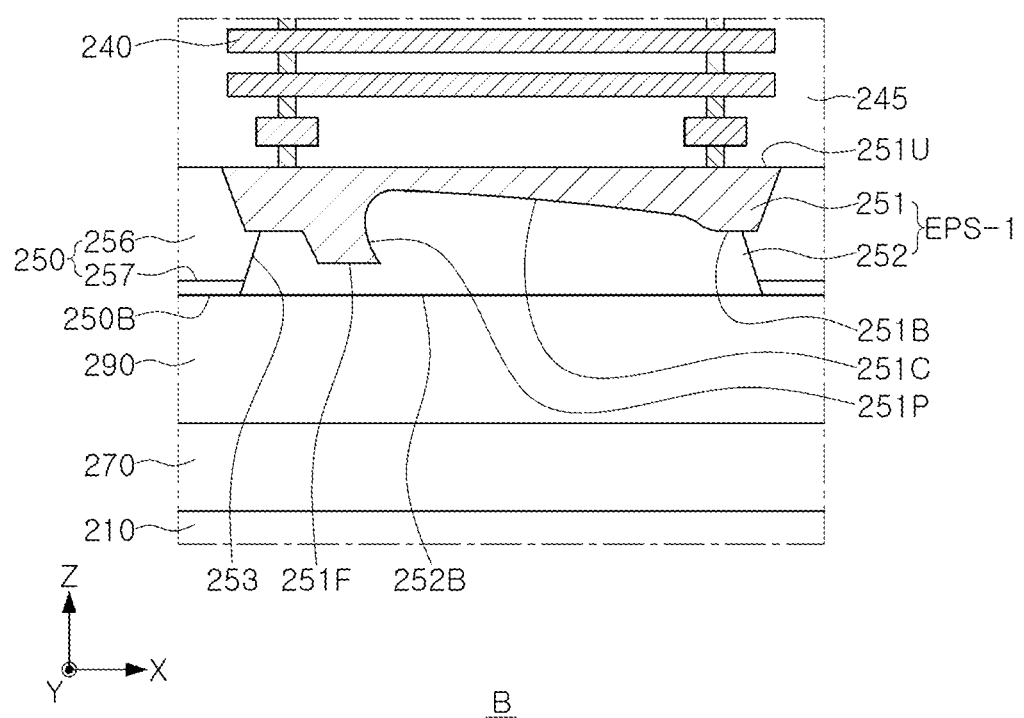
FIG. 3 is an enlarged diagram of portion "B" in FIG. 2.

A semiconductor package will be described according to an example embodiment with reference to FIGS. 1 to 3. FIG. 1 is a cross-sectional diagram illustrating a semiconductor package according to an example embodiment. FIG. 2 is an enlarged diagram illustrating portion "A" in FIG. 1. FIG. 3 is an enlarged diagram illustrating portion "B" in FIG. 2.

Referring to FIGS. 1 and 2, a semiconductor package 1A may include a base 10, a lower structure 100 on the base 10 and coupled to the base 10 by a connection structure 50, and a plurality of semiconductor chips 200 on the lower structure 100. The semiconductor package 1A may further include a mold layer 300 covering the plurality of semiconductor chips 200.

The base 10 may be configured as a printed circuit board or a semiconductor chip. The lower structure 100 may be configured as a lower semiconductor chip different from the plurality of semiconductor chips 200. However, an example embodiment thereof is not limited thereto, e.g., the lower structure 100 may be configured as an interposer substrate.

The plurality of semiconductor chips 200 may include one or a plurality of lower semiconductor chips 200A, 200B, and 200C, and an upper semiconductor chip 200D on the one or the plurality of lower semiconductor chips 200A, 200B, and 200C. The plurality of lower semiconductor chips 200A, 200B, and 200C may have the same shape or the same structure.

Each of the plurality of semiconductor chips 200 may be configured as a memory semiconductor chip or a logic semiconductor chip. For example, the memory semiconductor chip may be implemented as a volatile memory chip, e.g., a dynamic random access memory (DRAM) or a static random access memory (SRAM), or a non-volatile memory chips, e.g., a phase-change random access memory (PRAM), a magnetoresistive random access memory (MRAM), a ferroelectric random access memory (FeRAM), or a resistive random access memory (RRAM). The logic semiconductor chip may be implemented by, e.g., a microprocessor, an analog device, or a digital signal processor. For example, the semiconductor package 1A in the example embodiment may be used for a high bandwidth memory (HBM) product, an electro data processing (EDP) product, or the like.

Each of the plurality of semiconductor chips 200 may include a semiconductor body 210, a semiconductor internal circuit region 235 disposed below the semiconductor body 210, a lower insulating layer 250 disposed below the semiconductor internal circuit region 235, a bonding pad structure BPS-1 and a test pad structure EPS-1. Each of the lower semiconductor chips 200A, 200B, and 200C among the plurality of semiconductor chips 200 may further include an upper insulating layer 290 and an upper bonding pad 291 on the semiconductor body 210. Each of the lower semiconductor chips 200A, 200B, and 200C among the plurality of semiconductor chips 200 may further include a semiconductor protective insulating layer 270 disposed between the semiconductor body 210 and the upper insulating layer 290.

Each of the lower semiconductor chips 200A, 200B, and 200C may further include a through electrode structure 220 penetrating the semiconductor body 210 and electrically connecting the upper bonding pad 291 to the semiconductor internal wiring 240. The through electrode structure 220 may include a through electrode 230 formed of a conductive material, e.g., copper, and an insulating spacer 225 surrounding a side surface of the through electrode 230.

Each of the plurality of semiconductor chips 200 may have a front side 201F in contact with a semiconductor chip disposed in a relatively lower portion and a back side 201B disposed on the opposite surface of the front side 201F. A side surface 201S of each of the plurality of semiconductor chips 200 may extend from an edge of the back side 201B in a direction substantially perpendicular to the back side 201B. Among the semiconductor chips 200, the upper insulating layer 290 of the semiconductor chip disposed in a relatively lower portion, the lower insulating layer 250 of the semiconductor chip disposed in a relatively higher portion, and the test pad structure EPS-1 may be in contact with and coupled to each other. The upper bonding pad 291, e.g., a first bonding pad, of the semiconductor chip disposed in a relatively lower portion may be coupled to and in contact with the bonding pad structure BPS-1 of the semiconductor chip disposed in a relatively higher portion, e.g., the upper bonding pad 291 may be lower than the bonding pad structure BPS-1 relative to the lower structure 100. Accordingly, the semiconductor chips 200 may be stacked in order as the upper insulating layer 290, the lower insulating layer 250, and the test pad structure EPS-1 are coupled to and in contact with each other, and the upper bonding pad 291 and the bonding pad structure BPS-1 are in contact with and coupled to each other.

A lowermost semiconductor chip 200A among the lower semiconductor chips 200A, 200B, and 200C may be in contact with and coupled to the lower structure 100. For example, the lower insulating layer 250 and the test pad structure EPS-1 of the lowermost semiconductor chip 200A may be in contact with and coupled to the upper insulating layer 190 of the lower structure 100, and the bonding pad structure BPS-1 of the lowermost semiconductor chip 200A may be in contact with and coupled to the upper pad 195 of the lower structure 100.

The semiconductor body 210 may be configured as a semiconductor substrate, e.g., a silicon substrate, and the semiconductor internal circuit region 235 may be disposed on the front surface 210F of each of the plurality of semiconductor chips 200. The semiconductor internal circuit region 235 may include a semiconductor internal circuit 215 and the semiconductor internal wiring 240 electrically connecting the semiconductor internal circuit 215 to the bonding pad structure BPS-1. The semiconductor internal circuit 215 and the semiconductor internal wiring 240 may be disposed in the semiconductor internal insulating layer 245.

The upper insulating layer 290 and the lower insulating layer 250 may be formed of an insulating material which may allow the upper insulating layer 290 and the lower insulating layer 250 to be in contact with and coupled to each other, e.g., silicon oxide. However, the upper insulating layer 290 and the lower insulating layer 250 are not limited to silicon oxide and may be formed of, e.g., SiCN. In example embodiments, the lower insulating layer 250 may include a first insulating layer 256 and a second insulating layer 257, e.g., a protective layer (see FIG. 3). For example, the first insulating layer 256 may be formed of tetraethylorthosilicate (TEOS), and the second insulating layer 257 may be formed of PE-SiN.

The bonding pad structure BPS-1 may include a connection pad 254 and a lower bonding pad 255, e.g., a second bonding pad. The connection pad 254 may connect the semiconductor internal wiring 240 to the lower bonding pad 255 and may be formed of a conductive material. For example, the connection pad 254 may be formed of aluminum or an aluminum alloy. The lower bonding pad 255 may be formed of the same material as that of the upper bonding pad 291 so as to be in direct contact with and coupled to the upper bonding pad 291. The lower bonding pad 255 may be formed of a conductive material. For example, the lower bonding pad 255 may be formed of, e.g., copper, nickel, gold, silver, or alloys thereof.

The test pad structure EPS-1 will be described with reference to FIGS. 2 and 3. The test pad structure EPS-1 may include a test pad 251 and a bonding layer 252. An opening 253 penetrating the lower insulating layer 250 may be connected to the lower surface 251B of the test pad 251. The bonding layer 252 may be filled in the opening 253 to cover the test pad 251. The test pad 251 may be configured as a terminal for performing an electrical die sorting (EDS) test on each of the plurality of semiconductor chips 200.

The test pad 251 may be formed of a conductive material. In example embodiments, the test pad 251 may be formed of the same material as that of the connection pad 254 of the bonding pad structure BPS-1. For example, the test pad 251 may be formed of aluminum or an aluminum alloy. A width of the test pad 251 may be greater than a width of the connection pad 254 of the bonding pad structure BPS-1, e.g., along the X direction.

The lower surface 251B of the test pad 251 may be formed as a flat surface, e.g., a preliminary structure of the lower surface 251B of the test pad 251 prior to the EDS testing may be completely flat. However, a recess 251C and a protrusion 251P may be formed in partial regions of the lower surface 251B during the EDS test, e.g., contact between a probe and the lower surface 251B of the test pad 251 may scratch the lower surface 251B causing formation of the recess 251C (i.e., the cut in the surface) and the protrusion 251P (i.e., piled-up material removed from the recess 251C).

Also, a flat surface 251F formed by a planarization process may be formed at an end of the protrusion 251P. For example, the planarization process may be a mechanical polishing process or a chemical mechanical polishing process. The flat surface 251F of the protrusion 251P in the test pad 251 may be disposed at a level higher than a level of the lower surface 250B of the lower insulating layer 250, e.g., relative to the lower structure 100, so a distance from the flat surface 251F to the bottom of the lower structure 100 may be larger than a distance from the lower surface 250B to the lower structure 100. Also, the flat surface 251F of the test pad 251 may be disposed at a level lower than a level of the lower surface of the connection pad 254, e.g., relative to the lower structure 100.

The bonding layer 252 may be disposed to cover the lower surface 251B of the test pad 251 and to, e.g., completely, fill the opening 253 of the lower insulating layer 250. The bonding layer 252 may be formed of a same insulating material as that of the lower insulating layer 250, so as to be in contact with and coupled to the lower insulating layer 250. For example, the bonding layer 252 may be formed of silicon oxide. However, the bonding layer 252 is not limited to silicon oxide and may be formed of, e.g., SiCN or the like. The lower surface 252B of the bonding layer 252 may be coplanar with the lower surface 250B of the lower insulating layer 250.

The EDS test may be to determine whether a plurality of semiconductor chips are normal or defective by allowing a probe to be in contact with each of the test pads 251 of a plurality of semiconductor chips formed on a wafer and applying a specific current. In the process of allowing the probe to be in contact with the test pad 251, the probe may leave a mark, e.g., a scratch, on the surface of the test pad 251. A portion in direct contact with the probe may be scratched by the probe such that the recess 251C may be formed, and a piled-up protrusion may be formed around the recess 251C.

If the piled-up protrusion were to have a non-uniform height, i.e., without the flat surface 251F of the example embodiments, a height of the piled-up protrusion could have been greater than that of the lower surface 250B of the lower insulating layer 250, e.g., a distance from a bottom of the piled-up protrusion to the bottom of the lower structure 100 could have been smaller than the distance from the lower surface 250B of the lower insulating layer 250 to the bottom of the lower structure 100. Accordingly, such a piled-up protrusion could potentially form a step difference in the bonding surface during bonding the semiconductor chips to each other. Further, even if such a protrusion were to be planarized with the bonding surface, i.e., to be coplanar with the bonding surface, the protrusion would have been exposed to the bonding surface in the process of planarizing the bonding surface, thereby causing contamination of the planarization chamber, e.g., due to the conductive material of the piled-up protrusion.

In contrast, in an example embodiment, the protrusion 251P of the test pad 251 may be planarized to form the flat surface 251F having a level higher than a level of the lower surface 250B of the lower insulating layer 250, e.g., the flat surface 251F may be at a higher level than an interface between the bonding layer 252 and the lower insulating layer 250 relative to the lower structure 100, and the bonding layer 252 may cover the protrusion 251P. Accordingly, in the process of planarizing the bonding surface, the protrusion 251P may be prevented from being exposed to the bonding surface. Therefore, the chamber may be prevented from being contaminated in the process of planarizing the bonding surface.

Figure 4:
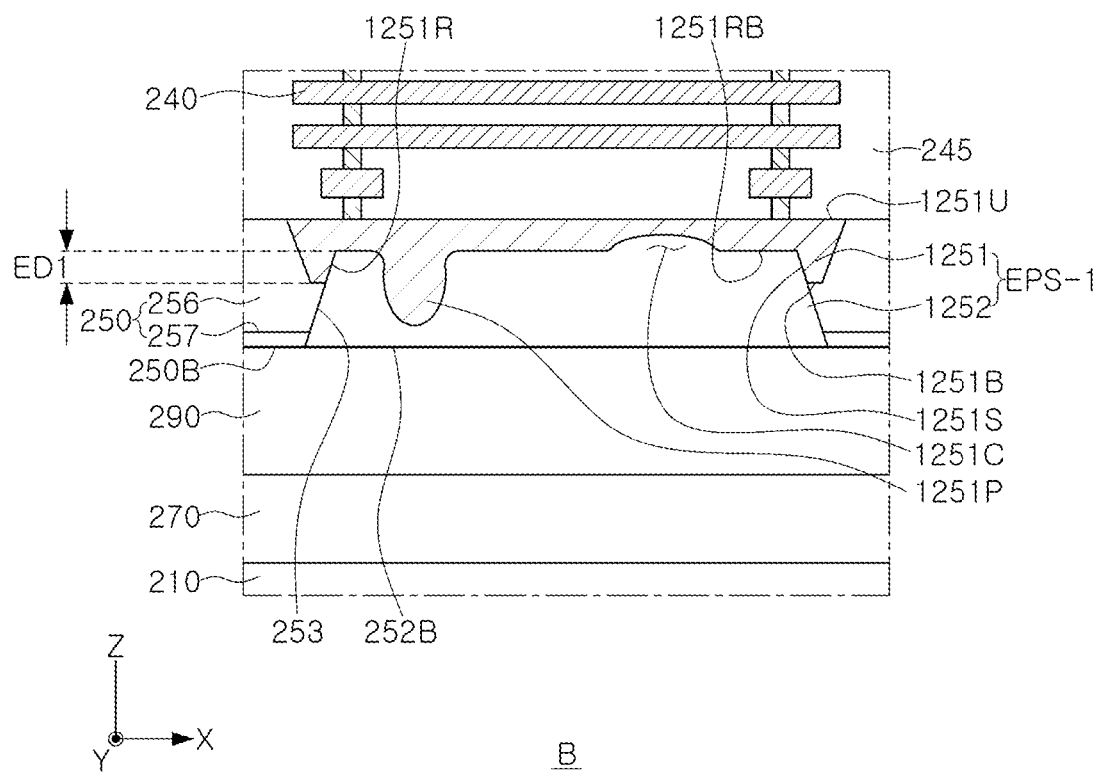
FIGS. 4 and 5 are diagrams of modified examples of the test pad in FIG. 3.
Figure 5:
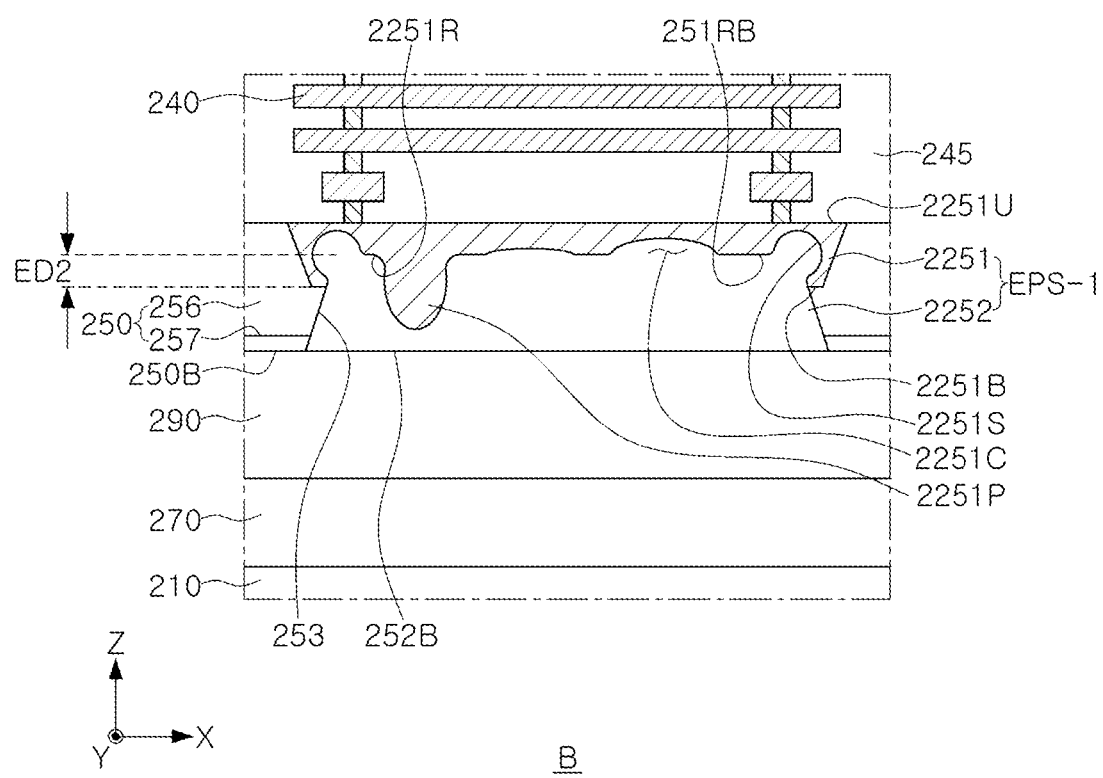

A modified example of the test pad of the semiconductor package will be described according to an example embodiment with reference to FIGS. 4 and 5. FIGS. 4 and 5 are diagrams illustrating modified examples of the test pad 251 illustrated in FIG. 3. The elements indicated by the same reference numerals as in the aforementioned example embodiments are the same elements as those of the aforementioned example embodiments, and thus, a detailed description thereof will not be provided. In the aforementioned example embodiment, a mechanical polishing process or a chemical mechanical polishing process may be performed on the protrusion to lower the height of the protrusion, but in the example embodiment, a dry etching process or a wet etching process may be performed on a test pad 1251 to lower the height of the protrusion 1251P, which may be a difference. Accordingly, in the example embodiment, the flat surface may not be formed at the end of the protrusion 1251P.

Referring to FIG. 4, the test pad 1251 in an example embodiment may include a groove 1251R having a sidewall 1251S extending from the sidewall of the opening 253 of the lower insulating layer 250 on the lower surface 1251B of the test pad 1251. The groove 1251R may be formed to have a depth ED1 of about 1 µm or more in the lower surface 1251B of the test pad 1251. The groove 1251R may be formed by performing a dry etching process on the lower surface 1251B of the test pad 1251. Accordingly, a flat surface may be formed on the bottom surface 1251RB of the groove 1251R by dry etching. In example embodiments, the recess 1251C and the protrusion 1251P, which may not be removed by dry etching, may remain in a portion of the bottom surface 1251RB, and similarly to the aforementioned example embodiment, the level of the protrusion 1251P may be higher than the lower surface 250B of the lower insulating layer 250. Accordingly, in the example embodiment, the protrusion 1251P may be prevented from being exposed to the bonding surface, similarly to the aforementioned example embodiment. Therefore, the chamber may be prevented from being contaminated in the process of planarizing the bonding surface.

Referring to FIG. 5, a test pad 2251 in the example embodiment may include a groove 2251R having a sidewall 2251S lateral etched along the side surface below the sidewall of the opening 253 of the lower insulating layer 250 on the lower surface 2251B of the test pad 2251. The groove 2251R may be formed to have a depth ED2 of about 1 μm or more in the lower surface 2251B of the test pad 2251. The groove 2251R may be formed by performing a wet etching process on the lower surface 2251B of the test pad 2251. Accordingly, a flat surface may be formed on the lower surface 2251RB of the groove 2251R by wet etching. In example embodiments, a recess 2251C and a protrusion 2251P which may not be removed by wet etching may remain in a portion of the lower surface 2251RB of the groove 2251R, and similarly to the aforementioned example embodiment, a level of the protrusion 2251P may be higher than a level of the lower surface 250B of the lower insulating layer 250. Accordingly, similarly to the aforementioned example embodiment, the protrusion 2251P may be prevented from being exposed to the bonding surface in the example embodiment. Therefore, the chamber may be prevented from being contaminated in the process of planarizing the bonding surface.

Figure 6:
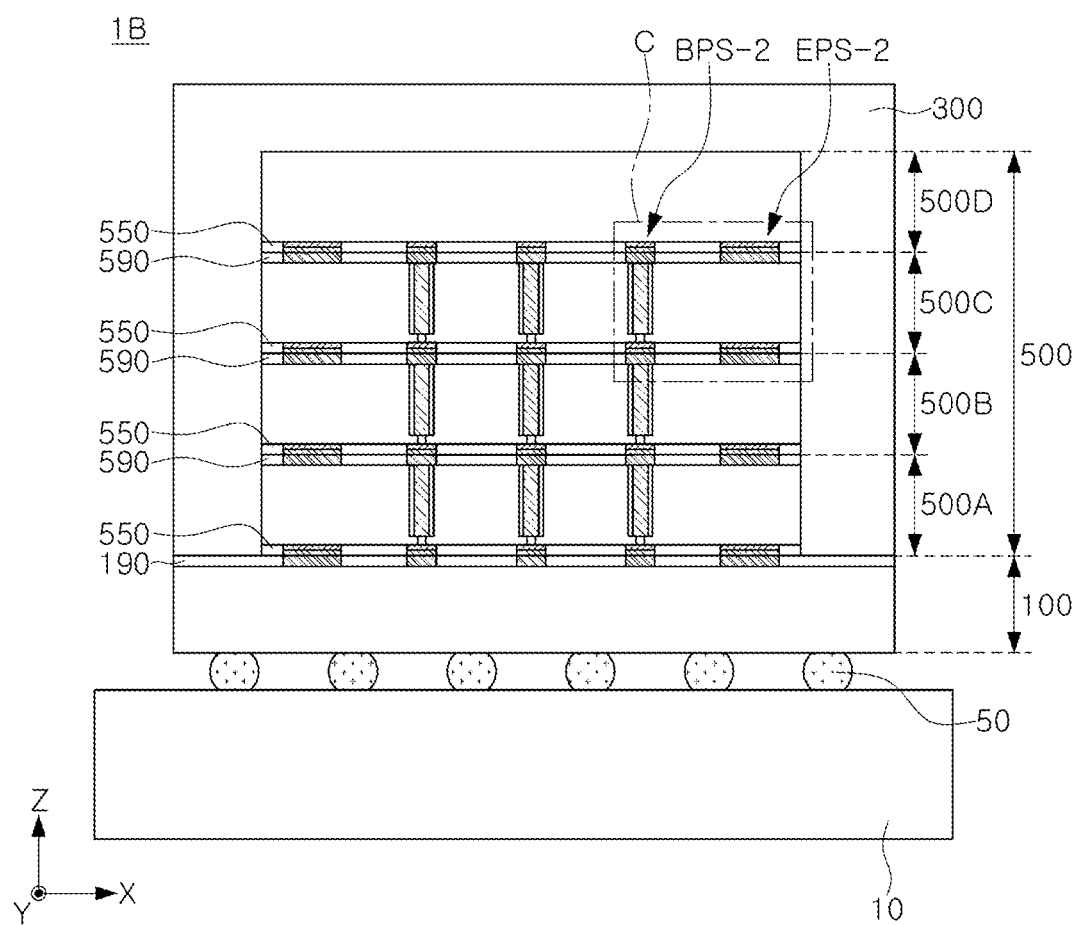
FIG. 6 is a cross-sectional diagram illustrating a semiconductor package according to an example embodiment of the present disclosure.
Figure 7:
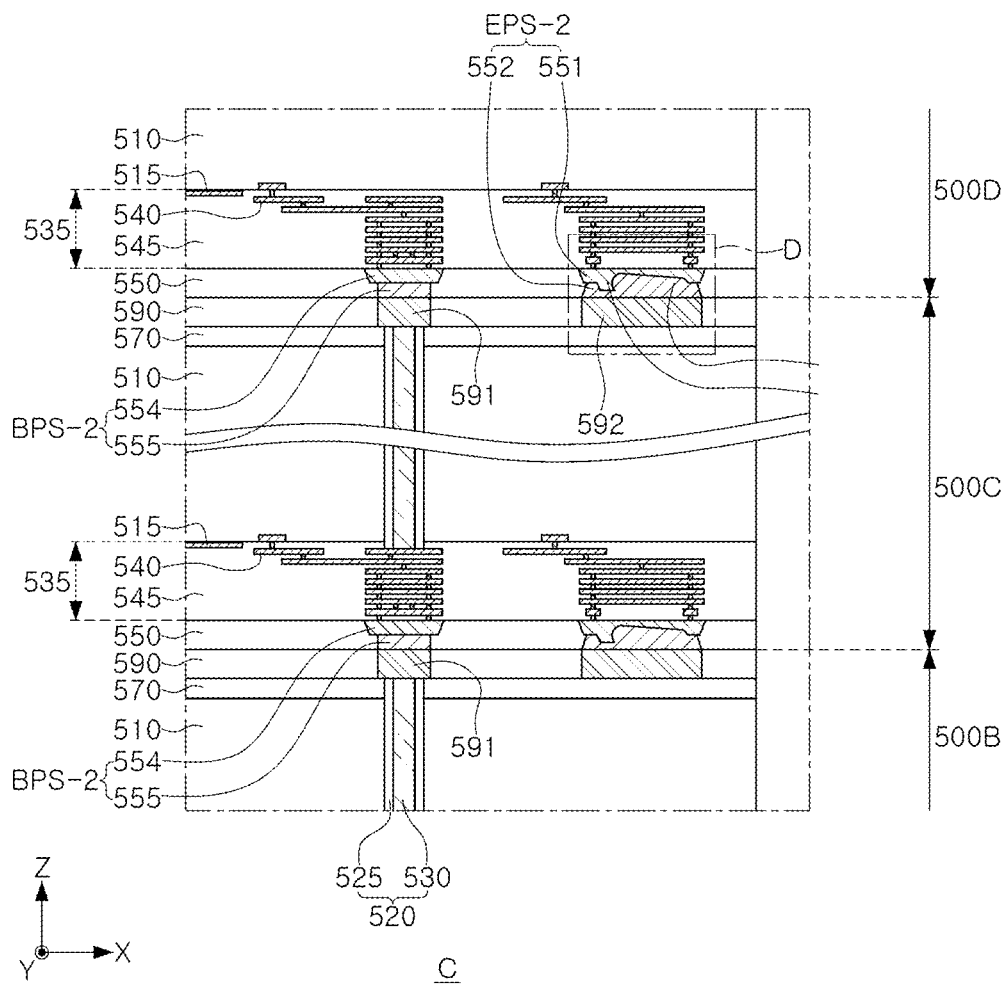
FIG. 7 is an enlarged diagram of portion "C" in FIG. 6.
Figure 8:
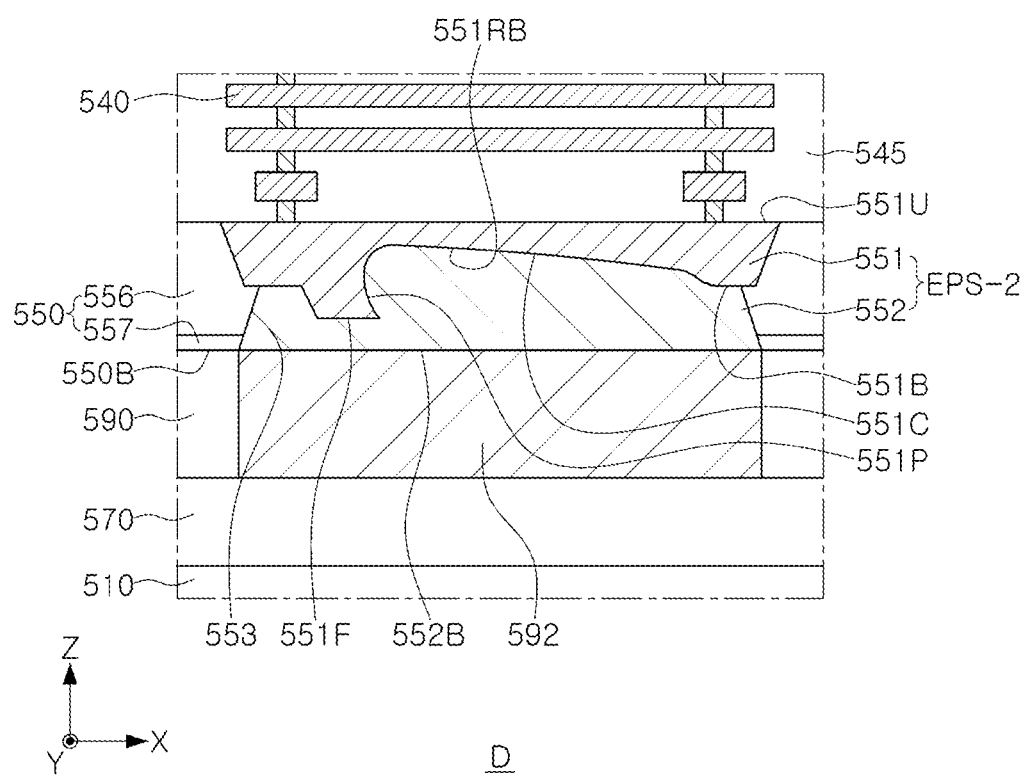
FIG. 8 is an enlarged diagram of portion "D" in FIG. 7.

A semiconductor package will be described according to an example embodiment with reference to FIGS. 6 to 8. FIG. 6 is a cross-sectional diagram illustrating a semiconductor package according to an example embodiment. FIG. 7 is an enlarged diagram illustrating portion "C" in FIG. 6. FIG. 8 is an enlarged diagram illustrating portion "D" in FIG. 7. In an example embodiment, differently from the semiconductor package in FIG. 1, a bonding layer 552 may be formed of a conductive material, and a dummy bonding pad 592 penetrating an upper insulating layer 590 may be further disposed in a region bonded to the bonding layer 552. The other configurations are the same as those of the semiconductor package in FIG. 1 in the aforementioned example embodiment, and thus, a detailed description thereof will not be provided. The elements 500s in FIGS. 6 to 8 may correspond to the elements 200s in FIGS. 1 to 3, respectively.

Referring to FIGS. 6 and 7, the semiconductor package 1B may include the base 10, the lower structure 100 on the base 10 and coupled to the base 10 by the connection structure 50, and a plurality of semiconductor chips 500 on the lower structure 100. The semiconductor package 1B may further include the mold layer 300 covering the plurality of semiconductor chips 500.

The plurality of semiconductor chips 500 may include one or a plurality of lower semiconductor chips 500A, 500B, and 500C, and an upper semiconductor chip 500D on the one or the plurality of the lower semiconductor chips 500A, 500B, and 500C. Each of the plurality of semiconductor chips 500 may include a semiconductor body 510, a semiconductor internal circuit region 535 disposed below the semiconductor body 510, a lower insulating layer 550 disposed below the semiconductor internal circuit region 535, a bonding pad structure BPS-2 and a test pad structure EPS-2. Among the plurality of semiconductor chips 500, each of the lower semiconductor chips 500A, 500B, and 500C may further include the upper insulating layer 590 on the semiconductor body 510, an upper bonding pad 591, and the dummy bonding pad 592.

The dummy bonding pad 592 may be disposed to correspond to an area bonded to, e.g., and overlapping, the bonding layer 552 of the test pad structure EPS-2. The dummy bonding pad 592 may be formed of the same material as that of the bonding layer 552 so as to be in direct contact with and coupled to the bonding layer 552 formed of a conductive material. The dummy bonding pad 592 may be formed of a conductive material. For example, the dummy bonding pad 592 may be formed of copper, nickel, gold, silver, or alloys thereof.

Each of the lower semiconductor chips 500A, 500B, and 500C among the plurality of semiconductor chips 500 may further include a semiconductor protective insulating layer 570 disposed between the semiconductor body 510 and the upper insulating layer 590. Among the semiconductor chips 500, the upper insulating layer 590 of the semiconductor chip disposed in a relatively lower portion and the lower insulating layer 550 of the semiconductor chip disposed in a relatively higher portion may be in contact with and coupled to each other.

The dummy bonding pad 592 of the semiconductor chip disposed in a relatively lower portion may be in contact with and coupled to the test pad structure EPS-2 of the semiconductor chip disposed in a relatively higher portion, e.g., the dummy bonding pad 592 may be positioned at a lower level than the test pad structure EPS-2 relative to the lower structure 100. The upper bonding pad 591 of the semiconductor chip in a relatively lower portion may be in contact with and coupled to the bonding pad structure BPS-2 of the semiconductor chip disposed in a relatively higher portion, e.g., the upper bonding pad 591 may be positioned at a lower level than the bonding pad structure BPS-2 relative to the lower structure 100. For example, as illustrated in FIG. 7, both the dummy bonding pad 592 and the upper bonding pad 591 may be at a same level, e.g., penetrating through and having a same thickness as the upper insulating layer 590. Accordingly, the semiconductor chips 500 may be stacked in order, e.g., sequentially, with the upper insulating layer 590 in contact with and coupled to the lower insulating layer 550, the dummy bonding pad 592 in contact with and coupled to the test pad structure EPS-2, and the upper bonding pad 591 in contact with and coupled to the bonding pad structure BPS-2.

Referring to FIG. 8, the test pad structure EPS-2 may include the test pad 551 and the bonding layer 552. An opening 553 penetrating the lower insulating layer 550 may be connected to the lower surface 551B of the test pad 551. The bonding layer 552 may be filled in the opening 553 to cover the test pad 551.

The test pad 551 may be formed of a conductive material. In an example embodiment, the test pad 551 may be formed of the same material as that of the connection pad 554 of the bonding pad structure BPS-2. For example, the test pad 551 may be formed of aluminum or an aluminum alloy. The lower surface 551B of the test pad 551 may be formed as a flat surface entirely, but a recess 551C and a protrusion 551P may be formed in partial regions of the lower surface 551B during the EDS test. Similarly to the protrusion in FIG. 1 described in the aforementioned example embodiment, a flat surface 551F formed by a planarization process may be formed at the end of the protrusion 551P, and the planarization process may be a mechanical polishing process or a chemical mechanical polishing process. The protrusion 551P has the same configuration as that of the protrusion in FIG. 1 described in the aforementioned example embodiment, and thus, a detailed description thereof will not be provided.

The bonding layer 552 may be disposed to cover the lower surface 551B of the test pad 551 and to fill the opening 553 of the lower insulating layer 550. The bonding layer 552 may be formed of a same conductive material as that of the dummy bonding pad 592, so as to be in contact with and coupled to the dummy bonding pad 592. For example, the bonding layer 552 may be formed of copper, nickel, gold, silver, or alloys thereof. Since the bonding layer 552 is formed of the same conductive material as that of the dummy bonding pad 592, the bonding layer 552 may have higher conductivity than in the example in which the bonding layer 552 is formed of an insulating material. Accordingly, heat dissipation efficiency of the semiconductor package 1B may improve.

Figure 9:
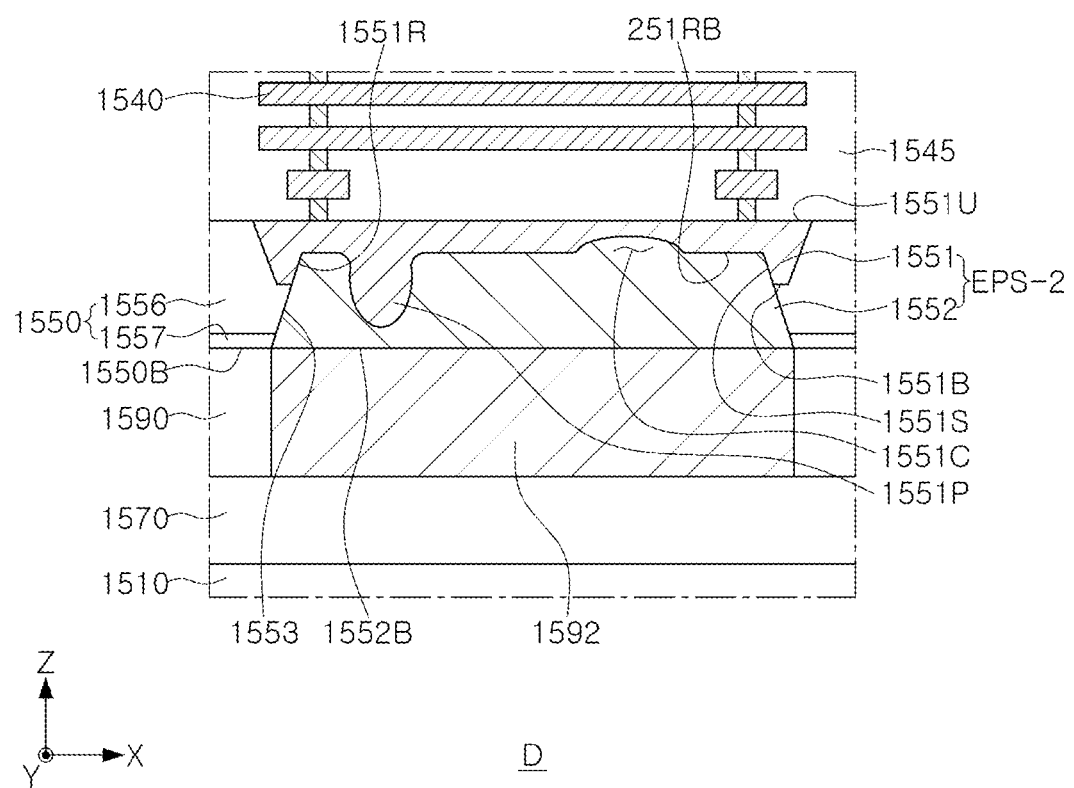
FIGS. 9 and 10 are diagrams of modified examples of the test pad in FIG. 7.
Figure 10:
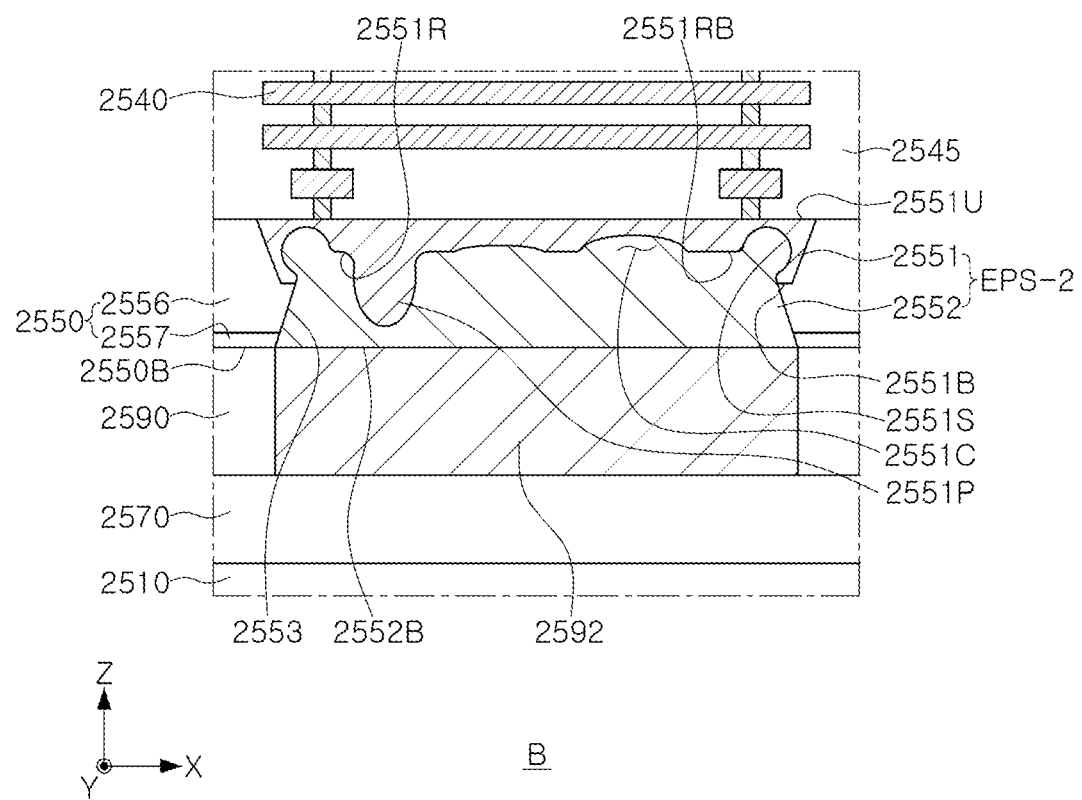

A modified example of the test pad of the semiconductor package according to an example embodiment will be described with reference to FIGS. 9 and 10. FIGS. 9 and 10 are diagrams illustrating modified examples of the test pad 551 illustrated in FIG. 7. Also, FIGS. 9 and 10 illustrate modified examples of the test pad 551 illustrated in FIGS. 4 and 5, respectively. The elements indicated by the same reference numerals as in the aforementioned example embodiments are the same elements as those of the aforementioned example embodiments, and thus, a detailed description thereof will not be provided. In the example embodiment in FIGS. 4 and 5, the bonding layer may be formed of an insulating material, and may be in contact with and coupled to the lower insulating layer, whereas, in the example embodiment in FIGS. 9 and 10, the bonding layer may be formed of a conductive material and may be in contact with and coupled to the dummy bonding pad.

Referring to FIG. 9, a test pad 1551 in an example embodiment may include a groove 1551R having a sidewall 1551S extending from the sidewall of the opening 1553 of the lower insulating layer 1550 on the lower surface 1551B of the test pad 1551. The groove 1551R may be formed by performing a dry etching process on the lower surface 1551B of the test pad 1551. Accordingly, a flat surface may be formed on the bottom surface 1551RB of the groove 1551R by dry etching. In the example embodiment, a recess 1551C and a protrusion 1551P, which may not be removed by dry etching, may remain in a portion of the bottom surface 1551RB, and similarly to the aforementioned example embodiment, the level of the protrusion 1551P may be higher than a level of the lower surface 1550B of the lower insulating layer 1550. Accordingly, in the example embodiment, the protrusion 1551P may be prevented from being exposed to the bonding surface, similarly to the aforementioned example embodiment. Therefore, in the process of planarizing the bonding surface, the chamber may be prevented from being contaminated. Also, the bonding layer 1552 may be formed of the same conductive material as that of the dummy bonding pad 1592 such that the bonding layer 1552 may have higher conductivity than in the example in which the bonding layer 1552 is formed of an insulating material. Accordingly, heat dissipation efficiency of the semiconductor package in FIG. 9 may improve.

Referring to FIG. 10, a test pad 2551 in the example embodiment may include a groove 2551R having a sidewall 2551S laterally etched along the side surface below the sidewall of the opening 2553 of the lower insulating layer 2550 on the lower surface 2551B of the test pad 2551. The groove 2551R may be formed by performing a wet etching process on the lower surface 2551B of the test pad 2551. Accordingly, a flat surface may be formed on the lower surface 2551RB of the groove 2551R by wet etching. In example embodiments, a recess 2551C and a protrusion 2551P, which may not be removed by wet etching, may remain in a portion of the lower surface 2551RB of the grooves 2551R, and similarly to the aforementioned example embodiment, a level of the protrusion 2551P may be higher than a level of the lower surface 2550B of the lower insulating layer 2550. Accordingly, in the example embodiment, the protrusion 2551P may be prevented from being exposed to the bonding surface, similarly to the aforementioned example embodiment. Therefore, in the process of planarizing the bonding surface, the chamber may be prevented from being contaminated. Also, the bonding layer 2552 may be formed of the same conductive material as that of the dummy bonding pad 2592, such that the bonding layer 2552 may have a higher conductivity than the example in which the bonding layer 2552 is formed of an insulating material. Accordingly, heat dissipation efficiency of the semiconductor package in FIG. 10 may improve.

Figure 11:
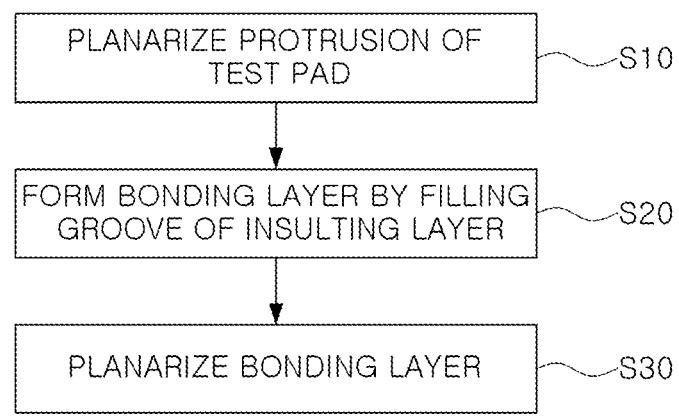
FIG. 11 is a flowchart of a method of manufacturing a semiconductor package according to an example embodiment of the present disclosure.

A method of manufacturing a semiconductor package will be described according to an example embodiment with reference to FIGS. 11 to 15. FIG. 11 is a flowchart illustrating stages in a method of manufacturing a semiconductor package according to an example embodiment. FIGS. 12 to 15 are cross-sectional diagrams illustrating stages in a method of manufacturing a semiconductor package according to an example embodiment.

Figure 12:
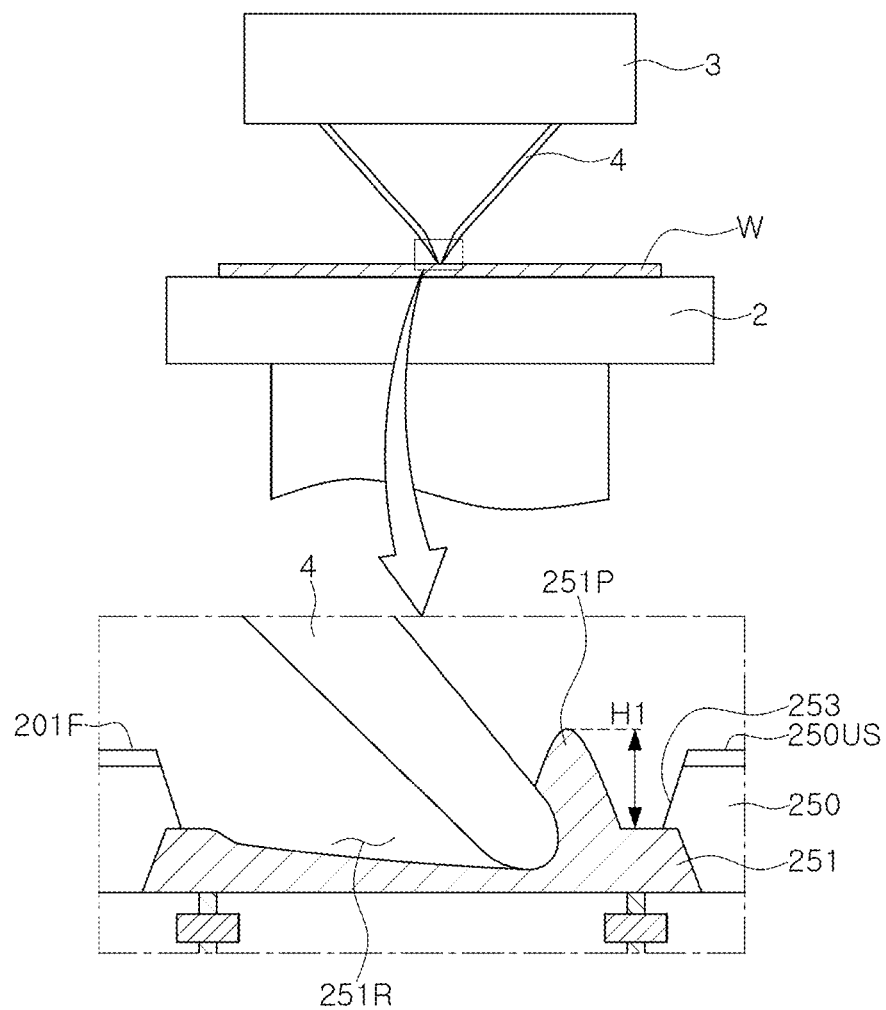
FIGS. 12 to 15 are cross-sectional diagrams of stages in a method of manufacturing a semiconductor package according to an example embodiment of the present disclosure.

Referring to FIG. 12, an EDS test may be performed on a wafer W with a plurality of semiconductor chips. Each of the semiconductor chips on the wafer W may include at least one test pad 251 exposed through the opening 253 in the lower insulating layer 250.

In detail, the wafer W may be placed, e.g., positioned, on an upper surface of a chuck 2, and a probe 4 may contact each of test pads 251 to apply current thereto. The upper surface 250US of the lower insulating layer 250, i.e., a surface facing the probe 4, may be the front side 201F in the example embodiment in FIG. 2. During the EDS test, a recess 251C, which is a scratch mark, may be formed by the probe 4 in a region of the surface of the test pad 251 due to contact with the probe 4. Also, a protrusion 251P, in which the test pads 251 are piled-up, may be formed around the recess 251C. The protrusion 251P may be formed to have a height H1, which is greater than that of the upper surface 250US of the lower insulating layer 250. For example, due to repeated contact and/or force applied by the probe 4 to the test pad 251 during testing, an upper surface of the test pad 251 contacted by the probe 4 may be scratched, thereby causing formation of a cut, i.e., the recess 251C, and piled-up material removed from the cut, i.e., from the recess 251C, forming the protrusion 251P that may extend above the upper surface 250US of the lower insulating layer 250.

Figure 13:
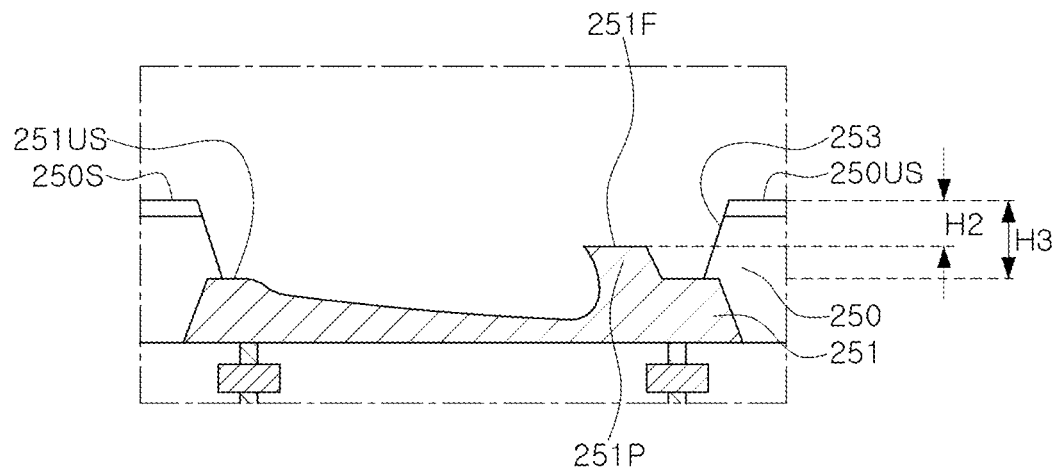

Referring to FIGS. 11 and 13, the protrusion 251P of the test pad 251 may be planarized through the opening 253 (S10). The planarization of the protrusion 251P may be performed through a mechanical polishing process or a chemical mechanical polishing process. In the process of planarizing the protrusion 251P, an end of the protrusion 251P may be polished such that the flat surface 251F may be formed. After the planarization process is completed, a cleaning process for cleaning the inside of the opening 253 may be performed. When the thickness of the test pad 251 is about 2 µm to about 3 and the height H3 of the opening 253 is about 3 µm to about 4 the planarization process may be performed until the flat surface 251F is lowered from the upper surface 250US of the lower insulating layer 250 by at least about 1 µm or more. Accordingly, the flat surface 251F may have a difference H2 of at least about 1 µm or more from the upper surface 250US of the lower insulating layer 250. However, an example embodiment thereof is not limited thereto, and in the process of planarizing the bonding layer filled in the opening 253 in a subsequent process, it may be sufficient to be polished by a height in which an end of the protrusion 251P is not exposed, e.g., does not extend above the upper surface 250US of the lower insulating layer 250. When a chemical mechanical polishing process is applied, a slurry having high selectivity for the conductive material may be used, such that the lower insulating layer 250 may be less polished, while the protrusion 251P formed of the conductive material may be selectively polished.

Figure 14:
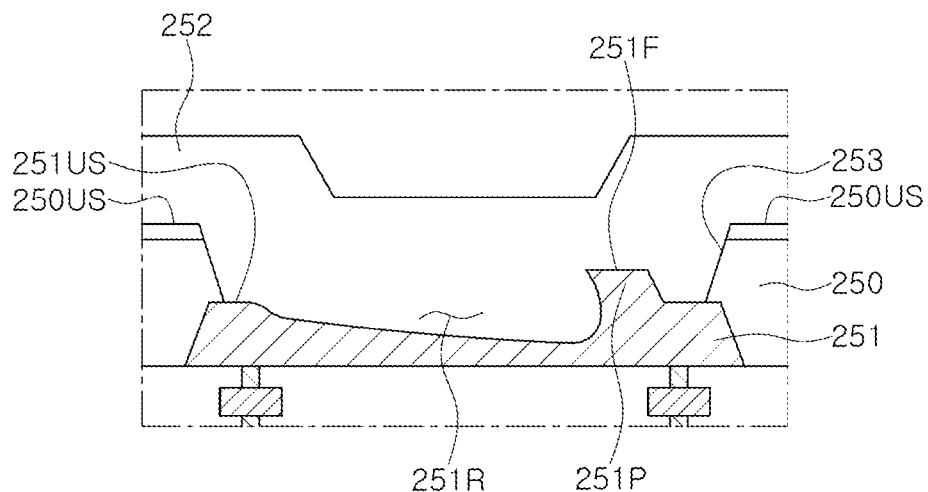

Referring to FIGS. 11 and 14, the bonding layer 252 may be formed to cover the test pad 251 in the opening 253 and the upper surface 250US of the lower insulating layer 250 (S20). The bonding layer 252 may be formed by depositing an insulating material or a conductive material. For example, the insulating material may be at least one of silicon oxide and SiCN, and the conductive material may be one of copper, nickel, gold, silver, or alloys thereof.

Figure 15:
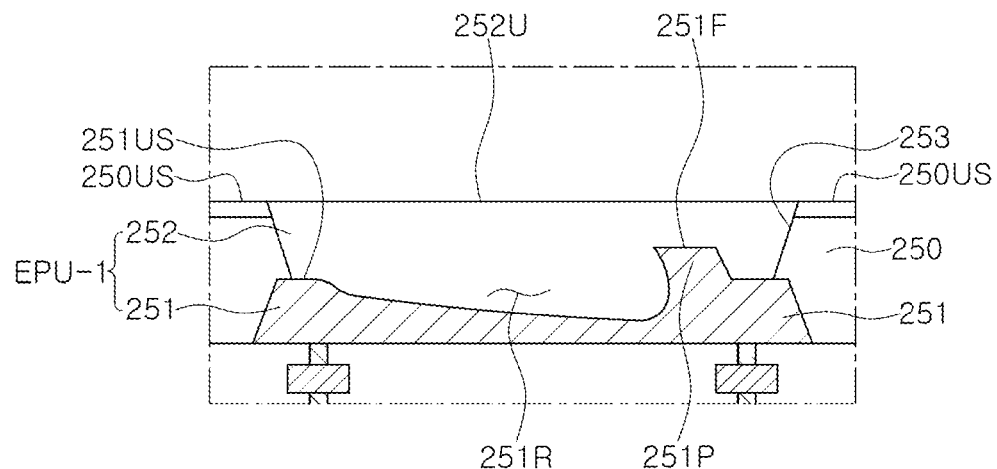

Referring to FIGS. 11 and 15, the bonding layer 252 may be planarized (S30). The planarization of the bonding layer 252 may be performed through a chemical mechanical polishing process. The planarization process may be performed until the lower insulating layer 250 is exposed. Thereafter, the wafer W may be cut and divided into a plurality of individual semiconductor chips, and the plurality of divided semiconductor chips may be stacked, thereby manufacturing a semiconductor package.

Figure 16:
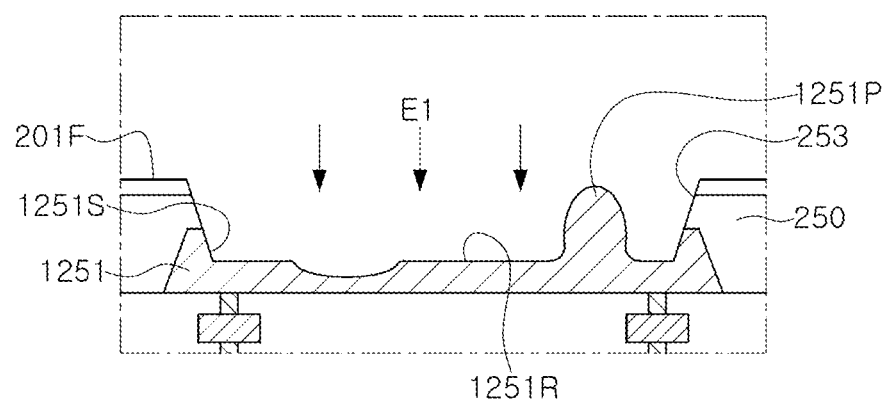
FIGS. 16 and 17 are cross-sectional diagrams of stages in a method of manufacturing a semiconductor package according to an example embodiment of the present disclosure.
Figure 17:
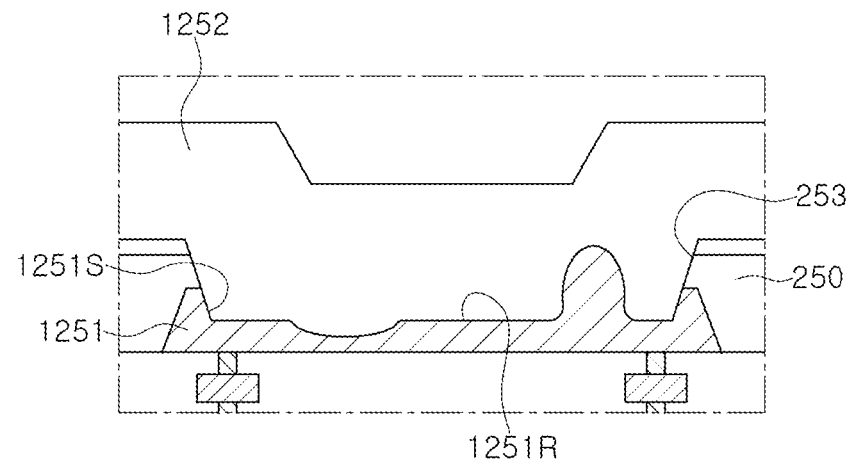

A method of manufacturing a semiconductor package will be described according to another example embodiment with reference to FIGS. 16 and 17. FIGS. 16 and 17 illustrate subsequent processes of the aforementioned example embodiment in FIG. 12.

Referring to FIG. 16, the protrusion 1251P of the test pad 1251 may be planarized through the opening 253. The planarization of the protrusion 1251P may be performed through a dry etching process E1. After the planarization process is completed, a cleaning process for cleaning the inside of the opening 253 may be performed. When the dry etching process E1 is performed, the upper surface of the test pad 1251 may be anisotropically etched in a vertical direction such that a groove 1251R may be formed in the upper surface of the test pad 1251. In this process, since the surface of the protrusion 1251P is also anisotropically etched, the height of the protrusion 1251P may be lowered. When the thickness of the test pad is about 2 µm to about 3 µm, and the height of the opening 253 is about 3 µm to about 4 µm, the dry etching process may be performed until the end of the protrusion 1251P is lowered from the upper surface 250US of the lower insulating layer 250 by at least about 1 µm or more. However, an example embodiment thereof is not limited thereto, and in the process of planarizing the bonding layer filled in the opening 253 in a subsequent process, it may be sufficient to be polished by a height in which an end of the protrusion 1251P is not exposed, e.g., above the upper surface 250US of the lower insulating layer 250.

Referring to FIG. 17, a bonding layer 1252 may be formed to cover the test pad 1251 in the opening 253 and the upper surface of the lower insulating layer 250. The bonding layer 1252 may be formed by depositing an insulating material or a conductive material. For example, the insulating material may be at least one of silicon oxide and SiCN, and the conductive material may be one of copper, nickel, gold, silver, or alloys thereof. Thereafter, a semiconductor package may be manufactured by performing the process illustrated in FIG. 15 and subsequent processes.

Figure 18:
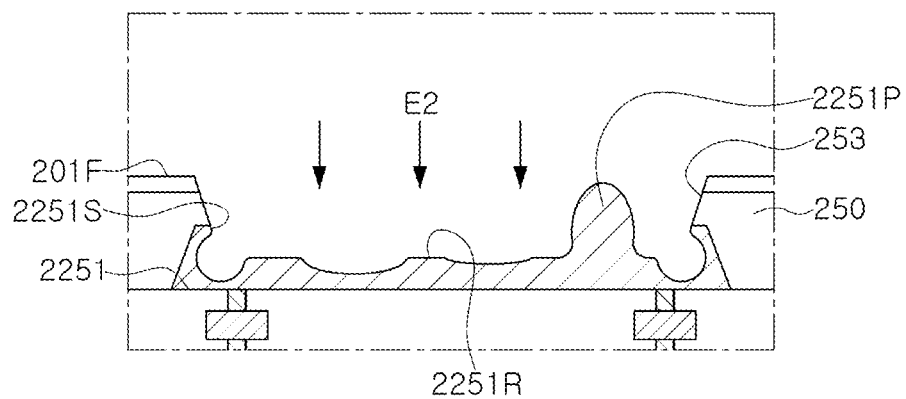
FIGS. 18 and 19 are cross-sectional diagrams of stages in a method of manufacturing a semiconductor package according to an example embodiment of the present disclosure.
Figure 19:
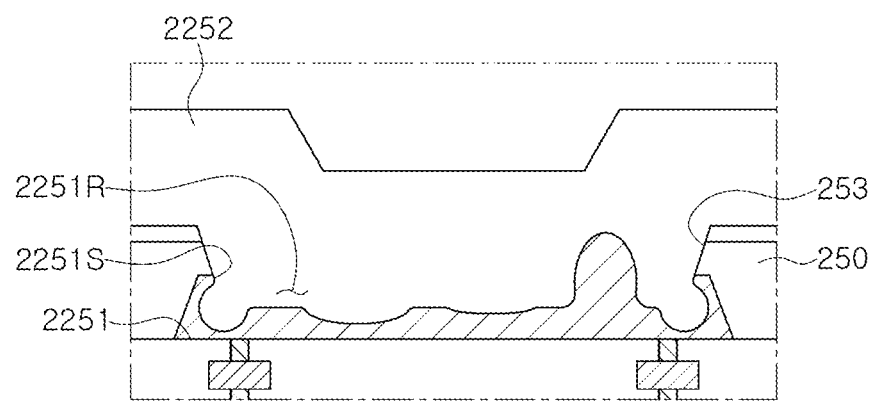

A method of manufacturing a semiconductor package will be described according to another example embodiment with reference to FIGS. 18 and 19. FIGS. 18 and 19 illustrate subsequent processes of the aforementioned example embodiment in FIG. 12.

Referring to FIG. 18, the protrusion 2251P of the test pad 2251 may be planarized through the opening 253. The planarization of the protrusion 2251P may be performed through a wet etching process E2. After the planarization process is completed, a cleaning process for cleaning the inside of the opening 253 may be performed. When the wet etching process E2 is performed, the upper surface of the test pad 2251 may be isotropically etched, such that the groove 2251R having the sidewall 2251S laterally etched along the side surface below the sidewall of the opening 253 of the lower insulating layer 250 may be formed. In this process, since the surface of the protrusion 2251P is also isotropically etched, the height of the protrusion 2251P may be lowered. When the thickness of the test pad is about 2 µm to about 3 µm, and the height of the opening 253 is about 3 µm to about 4 µm, the wet etching process may be performed until the end of the protrusion 2251P is lowered from the upper surface 250US of the lower insulating layer 250 by at least about 1 µm or more. However, an example embodiment thereof is not limited thereto, and in a process of planarizing the bonding layer filled in the opening 253 in a subsequent process, it may be sufficient to be polished by a height in which an end of the protrusion 2251P is not exposed, e.g., above the upper surface 250US of the lower insulating layer 250.

Referring to FIG. 19, a bonding layer 2252L may be formed to cover the test pad 2251 in the opening 253 and the upper surface of the and the lower insulating layer 250. The bonding layer 2252L may be formed by depositing an insulating material or a conductive material. For example, the insulating material may be at least one of silicon oxide and SiCN, and the conductive material may be one of copper, nickel, gold, silver, or alloys thereof. Thereafter, a semiconductor package may be manufactured by performing the process illustrated in FIG. 15 and subsequent processes.

By way of summation and review, when a plurality of semiconductor chips or packages are stacked, it is important to identify whether each semiconductor chip or package operates normally. To identify whether the stacked semiconductor chips or the package operate normally, an EDS test may be performed by applying a current to test pads of each of the semiconductor chips and/or packages. However, during the EDS test processing, the test pads may be deformed, thereby causing defects in a subsequent process.

In contrast, according to example embodiments, a semiconductor package having improved yield and reliability may be provided. That is, according to example embodiments, by planarizing the protrusion of the test pad surface and covering the protrusion by a bonding layer, a semiconductor package having improved reliability and yield may be provided Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a first semiconductor chip including:
     a first semiconductor body,
     a first semiconductor internal circuit below the first semiconductor body,
     a first insulating layer disposed on an upper surface of the first semiconductor body, and
     a first bonding pad completely penetrating the first insulating layer; and
   a second semiconductor chip disposed on the first semiconductor chip and directly contacting an upper surface of the first insulating layer and including:
     a second semiconductor body,
     a second semiconductor internal circuit below the second semiconductor body,
     a second insulating layer directly contacting the first insulating layer,
     a bonding pad structure completely penetrating the second insulating layer and directly contacting the first bonding pad, and
     a test pad structure completely penetrating the second insulating layer and including:
       a test pad disposed in an opening penetrating the second insulating layer and having an upper surface coplanar with an upper surface of the second insulating layer and an uneven lower surface, wherein a bottommost portion of the uneven lower surface has a flat surface which extends in parallel to the upper surface of the test pad, and
       a bonding layer filling the opening and directly contacting the uneven lower surface of the test pad,
   wherein a portion of the test pad is buried in the bonding layer and a bottommost surface of the portion of the test pad corresponds to the flat surface.

2. The semiconductor package as claimed in claim 1, wherein the bonding layer includes a same material as a material of the first insulating layer.

3. The semiconductor package as claimed in claim 1, wherein the first semiconductor chip further includes a dummy bonding pad overlapping the test pad structure, the dummy bonding pad penetrating the first insulating layer and including a same material as a material of the first bonding pad.

4. The semiconductor package as claimed in claim 3, wherein the dummy bonding pad includes a same material as a material of the bonding layer, the dummy bonding pad being bonded to the bonding layer.

5. The semiconductor package as claimed in claim 1, wherein the test pad includes a material different from a material of the bonding layer, the test pad including aluminum.

6. The semiconductor package as claimed in claim 1, wherein the bonding pad structure further includes:
   a second bonding pad connected to the first bonding pad; and
   a connection pad on the second bonding pad, the second bonding pad being between the connection pad and the first bonding pad.

7. The semiconductor package as claimed in claim 6, wherein the connection pad includes a same material as a material of the test pad.

8. The semiconductor package as claimed in claim 6, wherein a width of the test pad is greater than a width of the connection pad.

9. The semiconductor package as claimed in claim 6, wherein the flat surface of the uneven lower surface has a level lower than a level of a lower surface of the connection pad relative to an interface between the bonding layer and the first insulating layer.

10. The semiconductor package as claimed in claim 1, wherein the second insulating layer, the bonding pad structure, and the test pad structure are below a semiconductor internal circuit region in which the second semiconductor internal circuit is disposed.

11. The semiconductor package as claimed in claim 1, wherein the second semiconductor chip further includes a through electrode penetrating the second semiconductor body and electrically connected to the first bonding pad.

12. The semiconductor package as claimed in claim 11, wherein the second semiconductor body is a silicon substrate.

13. The semiconductor package as claimed in claim 1, wherein a lower surface of the bonding layer is coplanar with a lower surface of the second insulating layer.

14. The semiconductor package as claimed in claim 1, further comprising a protective layer covering a lower surface of the second insulating layer, a lower surface of the protective layer being coplanar with a lower surface of the bonding layer.

15. A semiconductor package comprising:
   a lower structure including an upper insulating layer and an upper bonding pad completely penetrating the upper insulating layer; and
   a semiconductor chip disposed on the lower structure and directly contacting an upper surface of the upper insulating layer,
   wherein the semiconductor chip includes:
     a semiconductor body,
     a semiconductor internal circuit below the semiconductor body,
     a lower insulating layer directly contacting the upper insulating layer,
     a bonding pad structure completely penetrating the lower insulating layer and directly contacting the upper bonding pad, and
     a test pad structure completely penetrating the lower insulating layer and directly contacting the upper surface of the upper insulating layer of the lower structure,
   wherein the test pad structure includes:
     a test pad in an opening penetrating the lower insulating layer, and
     a bonding layer filling the opening and covering the test pad,
   wherein a maximum thickness of the test pad is smaller than a maximum thickness of the lower insulating layer, and
   wherein the test pad has a lowermost surface at a level higher than a level of a lower surface of the lower insulating layer relative to a bottom of the lower structure.

16. The semiconductor package as claimed in claim 15, wherein the test pad includes an upper surface coplanar with an upper surface of the lower insulating layer and an uneven lower surface, and
   wherein a bottommost portion of the uneven lower surface has a flat surface which extends in parallel to the upper surface of the test pad.

17. The semiconductor package as claimed in claim 15, wherein the test pad includes a groove facing the lower surface of the lower insulating layer, the groove having a sidewall extending from a sidewall of the opening of the lower insulating layer.

18. The semiconductor package as claimed in claim 15, wherein the test pad includes a groove extending from a sidewall of the opening of the lower insulating layer, the groove being laterally etched from the sidewall of the opening and facing the lower surface of the lower insulating layer.

19. A semiconductor package, comprising:

a lower structure; and a plurality of semiconductor chips vertically stacked on the lower structure, the plurality of semiconductor chips include first and second semiconductor chips in direct contact with each other, wherein the first semiconductor chip includes:
- a first semiconductor body,
- a first semiconductor internal circuit below the first semiconductor body,
- a first insulating layer disposed on an upper surface of the first semiconductor body, and
- a first bonding pad completely penetrating the first insulating layer, wherein the second semiconductor chip includes:
- a second semiconductor body,
- a second semiconductor internal circuit below the second semiconductor body,
- a second insulating layer directly contacting the first insulating layer,
- a bonding pad structure completely penetrating the second insulating layer and directly contacting the first bonding pad, and
- a test pad structure completely penetrating the second insulating layer and including:
  - a test pad disposed in an opening penetrating the second insulating layer and having an upper surface coplanar with an upper surface of the second insulating layer and an uneven lower surface, wherein a bottommost portion of the uneven lower surface has a flat surface which extends in parallel to the upper surface of the test pad, and
  - a bonding layer filling the opening and directly contacting the uneven lower surface of the test pad, wherein a portion of the test pad is buried in the bonding layer and a bottommost surface of the portion of the test pad corresponds to the flat surface, and wherein a maximum thickness of the test pad is smaller than a maximum thickness of the second insulating layer, and has a lowermost surface at a level higher than a level of a lower surface of the second insulating layer relative to a bottom of the lower structure.

* * * * *